United States Patent
Durham et al.

[11] Patent Number: 6,107,852
[45] Date of Patent: Aug. 22, 2000

[54] METHOD AND DEVICE FOR THE REDUCTION OF LATCH INSERTION DELAY

[75] Inventors: Christopher McCall Durham; Michael Ju Hyeok Lee; Visweswara Rao Kodali; Harsh Dev Sharma, all of Austin, Tex.

[73] Assignee: International Business Machines Corporation, Armonk, N.Y.

[21] Appl. No.: 09/081,001

[22] Filed: May 19, 1998

[51] Int. Cl.[7] .................................................. H03K 3/356
[52] U.S. Cl. ........................ 327/203; 327/211; 327/214
[58] Field of Search ..................... 326/40, 46; 327/199, 327/200, 201, 202, 203, 204, 208, 209, 210, 211, 212, 214, 215, 216, 217, 218, 219, 223, 224

[56] References Cited

U.S. PATENT DOCUMENTS

| | | | |
|---|---|---|---|
| 3,812,384 | 5/1974 | Skorup | 307/238 |
| 4,617,480 | 10/1986 | Au | 307/480 |
| 4,970,407 | 11/1990 | Patchen | 307/272.2 |
| 5,103,116 | 4/1992 | Sivilotti et al. | 307/272.2 |
| 5,132,577 | 7/1992 | Ward | 307/570 |
| 5,173,618 | 12/1992 | Eisenstadt | 307/269 |
| 5,189,315 | 2/1993 | Akata | 307/272.2 |
| 5,459,421 | 10/1995 | Shaw | 327/203 |
| 5,463,340 | 10/1995 | Takabatake et al. | 327/211 |
| 5,767,716 | 6/1998 | Ko | 327/203 |

Primary Examiner—Jeffrey Zweizig
Attorney, Agent, or Firm—Anthony V. S. England; Felsman, Bradley, Vaden, Gunter & Dillion, LLP

[57] ABSTRACT

A method and device are disclosed for the reduction of the penalty associated with inserting a latch in a circuit which is utilized to implement an integrated circuit in a data-processing system. A semiconductor device is disclosed which includes a main latch circuit, a feedback latch circuit and an output terminal. The main latch circuit is capable of receiving an input data signal and an input clock signal. The main latch circuit generates a latch output signal in response to the input data and clock signals. The feedback latch circuit is capable of receiving the latch output signal from the main latch circuit and storing the latch output signal. The feedback latch circuit is capable of generating a feedback latch circuit output signal which is received by the main latch circuit to maintain the latch output signal. The output terminal of the device is coupled to the feedback latch circuit for outputting a device output signal which is equal to the feedback latch circuit output signal.

11 Claims, 5 Drawing Sheets

Fig. 1 *Prior Art*

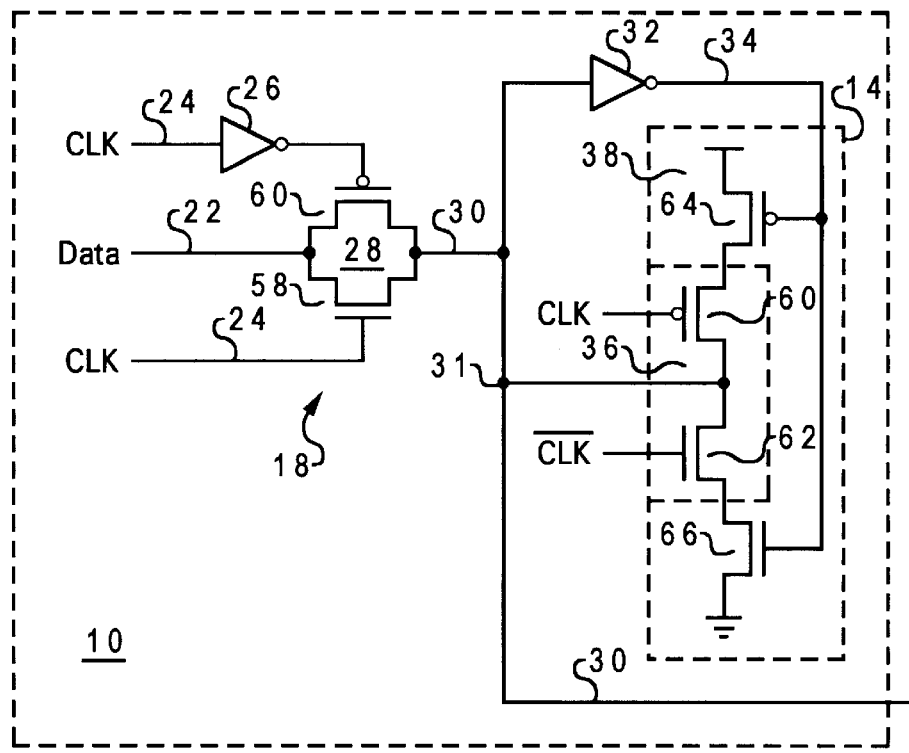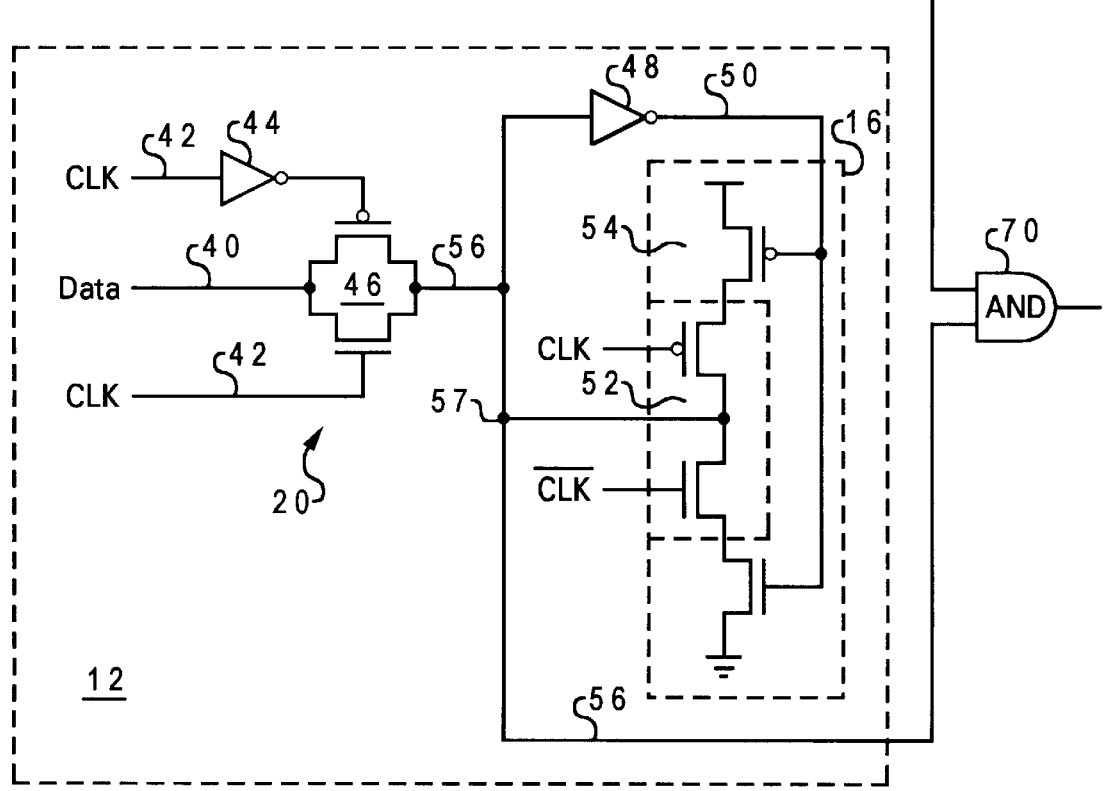
Fig. 2

METHOD AND DEVICE FOR THE REDUCTION OF LATCH INSERTION DELAY

BACKGROUND OF THE INVENTION

1. Technical Field

The present invention relates to data-processing systems and, in particular, to a method and device in a data-processing system for reducing the signal propagation delay penalty associated with inserting a latch element in a circuit included within the system. Still more particularly, the present invention relates to an improved latch device where the output of the latch device is taken from a feedback circuit included within the latch element.

2. Description of the Related Art

In current data-processing systems, clock speeds of VLSI circuit chips are continually increasing. Engineers continue to search for methods to improve speed by reducing circuit delays. Each such improvement has a direct affect on chip performance.

One area that has plagued engineers is the cost associated with inserting latches, or flip-flops, in the chip design. Latches are necessary and essential to create devices such as instruction/execution pipelines in microprocessors, general purpose state-machines and other devices. Without these latches, creation of these devices would be impossible. In order to design VLSI chips, insertion of latches is necessary.

However, a signal propagation delay penalty is associated with the insertion of a latch on the overall performance of the chip. Typically, the signal propagation delay penalty for inserting a latch is approximately 5% of the overall chip cycle time.

FIG. 1 is a schematic diagram of a typical D-type latch, also called a D-type flip-flop, in accordance with the prior art. The data is input into the transmission gate 1 on an input signal line and appears an output signal line after passing through an inverter 2 and an inverter 3 when the clock signal is high. The circuit receives both a clock signal and the complement of the clock signal utilizing inverter 8. Each signal going through this latch must pass through transmission gate 1 and the two inverters 2, 3 before arriving at the output 9. Transistors 5 and 6 act as a switch, while transistors 4 and 7 act as an inversion unit.

For example, in order to create a state machine, at least two latches are required. The total signal propagation delay penalty then climbs to 10%. Typically, a state machine will be comprised of many latches, thus increasing the signal propagation delay penalty associated with the insertion of these latches in the state machine. As cycle times of current microprocessors reach the one nanosecond range, the latch insertion signal propagation delay penalty becomes significant.

Therefore, a need exists for a method and system for reducing the signal propagation delay penalty associated with inserting a latch in an integrated circuit.

SUMMARY OF THE INVENTION

It is one object therefore of the present invention to provide an improved data-processing system.

It is another object of the present invention to provide a method and device in a data-processing system for reducing the signal propagation delay penalty associated with inserting a latch element in an integrated circuit.

It is yet another object of the present invention to provide a method and device in a data-processing system for reducing the signal propagation delay penalty for insertion of a latch element by taking the output of the latch device from a feedback circuit included within the latch element.

The foregoing objects are achieved as is now described. A method and device are disclosed for the reduction of the signal propagation delay penalty associated with inserting a latch in a circuit which is utilized to implement a state machine in a data-processing system. A semiconductor device is disclosed which includes a main latch circuit, a feedback latch circuit and an output terminal. The main latch circuit is capable of receiving an input data signal and an input clock signal. The main latch circuit generates a latch output signal in response to the input data and clock signals. The feedback latch circuit is capable of receiving the latch output signal from the main latch circuit and storing the latch output signal. The feedback latch circuit is capable of generating a feedback latch circuit output signal which is received by the main latch circuit to maintain the latch output signal. The output terminal of the device is coupled to the feedback latch circuit for outputting a device output signal which is equal to the feedback latch circuit output signal.

The above as well as additional objectives, features and advantages of the present invention will become apparent in the following detailed written description.

BRIEF DESCRIPTION OF THE DRAWINGS

The novel features are set forth in the appended claims. The present invention itself, however, as well as a preferred mode of use, further objectives and advantages thereof, will best be understood by reference to the following detailed description of a preferred embodiment when read in conjunction with the accompanying drawings, wherein:

FIG. 2 is a schematic diagram of a pair of improved latches and a load element in accordance with the method and system of the present invention;

DETAILED DESCRIPTION OF A PREFERRED EMBODIMENT

A preferred embodiment of the present invention and its advantages are better understood by referring to FIGS. 1–5 of the drawings, like numerals being used for like and corresponding parts of the accompanying drawings.

In accordance with the method and system of the present invention, the signal propagation delay penalty associated with the insertion of a latch in an integrated circuit which may be utilized to implement a state machine is significantly reduced by taking an output from a feedback circuit portion of the latch, instead of from the output of the main circuit of the latch.

Data output from single latches are typically combined with the output from other latches through combinational logic circuits to form other output signals in VLSI designs.

The present invention utilizes this design technique to create an improved latch circuit which reduces the signal propagation delay penalty associated with inserting a latch.

Figure 1:
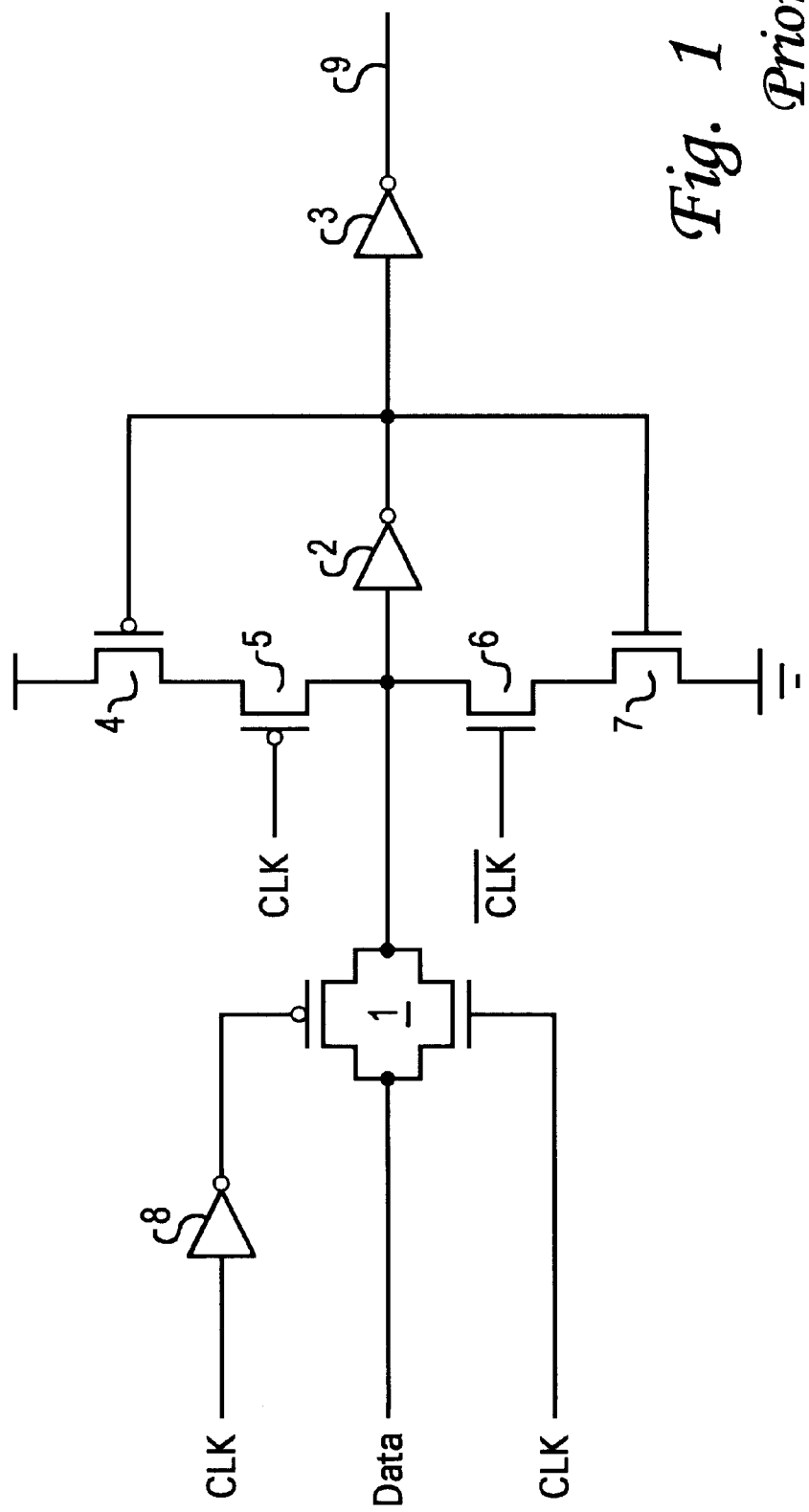
FIG. 1 is a schematic diagram of a D-type latch in accordance with the prior art.

In the present invention, the output of the latch is taken from the feedback portion of the latch circuit, instead of from the final inverter stage 3 (shown in the prior-art FIG. 1). In this manner, the delay penalty is significantly reduced.

FIG. 2 is a schematic diagram of two identical latches and a load in accordance with the method and system of the present invention. Latches 10 and 12 have a reduced associated signal propagation delay penalty because the output is taken from a feedback circuit 14, 16 instead of from a main circuit 18, 20.

Latch 10 includes main circuit 18 which includes an input data signal line 22, a clock signal line 24, a clock inverter 26, a transmission gate 28, an inverter 32 and a third signal line 34. Latch 10 also includes a feedback circuit 14 which includes a switch circuit 36, an inversion circuit 38 and an output signal line 30 output utilizing output terminal 31.

Similarly, latch 12 includes main circuit 20 which includes an input data signal line 40, a clock signal line 42, a clock inverter 44, a transmission gate 46, an inverter 48 and a third signal line 50. Latch 12 also includes a feedback circuit 16 which includes a switch circuit 52, an inversion circuit 54 and an output signal line 56 output utilizing output terminal 57.

Transmission gate 28 includes an N-channel transistor 58 and a P-channel transistor 60. Input signal line 22 is input into transmission gate 28, which is controlled by the complementary clock signals such that when the clock signal is high, the data signal is output on signal line 30. Transmission gate 28 and inverter 32 act as main circuit 18 to produce a signal-on-signal line 34. In the prior art, the output of a latch is taken from a signal line, such as signal line 34.

Feedback circuit 14 includes switch circuit 36 and inversion circuit 38 and acts to retain the signal it receives on line 34. Switch circuit 36 includes P-channel transistor 60 and N-channel transistor 62. Inversion circuit 30 includes P-channel transistor 64 and N-channel transistor 66. The clock signal is input into transistor 60, and the clock complement signal is input into transistor 62. The output of inversion circuit 38 is input into switch 36. The output of switch 36 is connected to signal line 30 and is the output of latch 10 taken from output terminal 31. Latch 12 is configured and operates in a manner similar to latch 10 and, therefore, will not be described in detail.

The output of the latch is produced on signal line 30 which is the output of feedback circuit 14. In this manner, the present invention results in a signal propagation delay penalty equal only to transmission circuit 28.

In FIG. 2, one load element is disclosed. AND gate 70 receives the output from signal line 30 from latch 10 and the output from signal line 56 from latch 12. Those skilled in the art will recognize that any type of load may be utilized, such as other types of logic gates (OR, NOR, NAND, AND or other logic gates) or a combination of any number of logic gates.

Taking the output of the latch from the feedback circuit instead of from the main circuit causes irregular timing parameters for the improved latch 10. The set-up and hold times for the improved latch are now irregular. To compensate for the irregular timing parameters, either an insertion algorithm must be used as described below in a second embodiment, or as described below in a first embodiment with all timing characteristics of all possible load elements being identical. Timing characteristics of an element include the set-up and hold time of the element.

In a first embodiment of the present invention, all possible load elements, such as AND gate 70, must be produced which all have identical input loading characteristics. Thus, the set-up and hold timing characteristics of each latch circuit can be designed with this set value. When each element is placed in the larger circuit, however, care must be taken not to increase the load significantly by moving the latch significantly away from the load.

Figure 3:
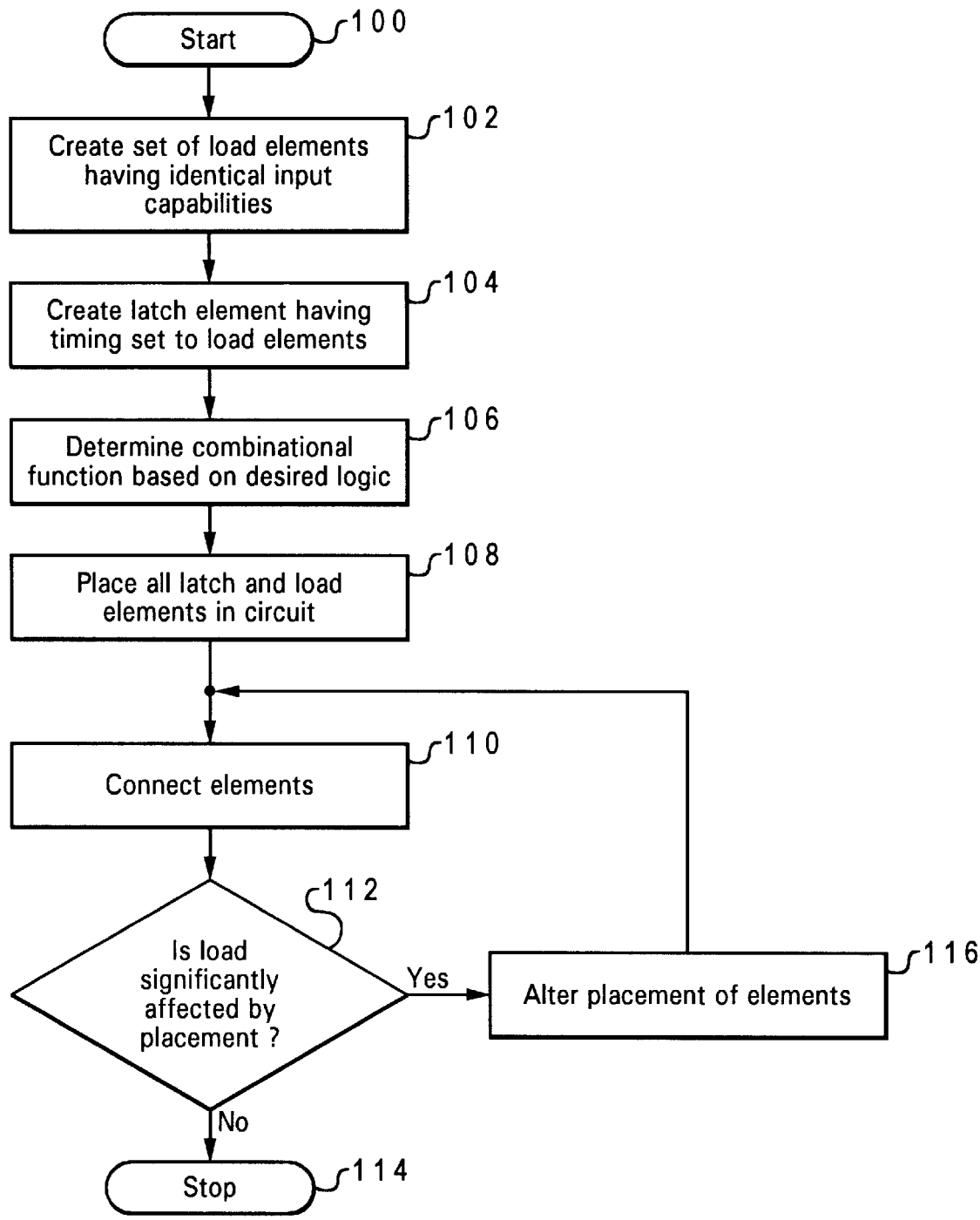
FIG. 3 is a high-level flow chart illustrating the creation and placement of latch and load elements in a circuit in accordance with a first embodiment of the present invention.

FIG. 3 is a high-level flow chart illustrating the creation and placement of latch and load elements in a circuit in accordance with the first embodiment of the present invention. The process starts as depicted at block 100 and thereafter passes to block 102 which illustrates the creation of a set of load elements, each having identical input capacitance. Next, block 104 depicts the creation of latch elements, such as depicted in FIG. 2, each having its timing characteristics designed for a load having the preset input capacitance. Thereafter, block 106 illustrates the determination of the combinational function of the overall circuit based on the desired logic for the circuit.

The process then passes to block 108 which depicts the placement of all latch and load elements in the overall circuit. Next, block 110 depicts the connection of all of the elements. Block 112, then, illustrates a determination of whether or not the load on each latch is significantly increased by the placement of each of the elements. If a determination is made that the load is not significantly increased by the placement of the elements, the process terminates as depicted at block 114. Referring again to block 112, if a determination is made that the load on a latch is significantly increased, the process passes to block 116 which depicts the alteration of the placement of the elements. The process then passes back to block 110.

A second embodiment for compensating for the irregular timing parameters of the improved latch 10 is to determine the timing characteristics of the latch with a particular load coupled to the latch, and then to utilize the determined timing characteristics when designing the remaining elements of a state machine in which improved latch 10 is utilized.

In order to compensate for the irregular timing parameters utilizing an insertion algorithm, the timing parameters of the latch must be measured. The timing parameters are dependent on the particular load selected.

Therefore, these timing parameters are measured for each latch element once the latch element is connected to its load element. In this manner, each load element need not be designed for any one particular latch element. Further, the timing characteristics of each latch element need not be known prior to connecting all of the elements together.

Figure 4:
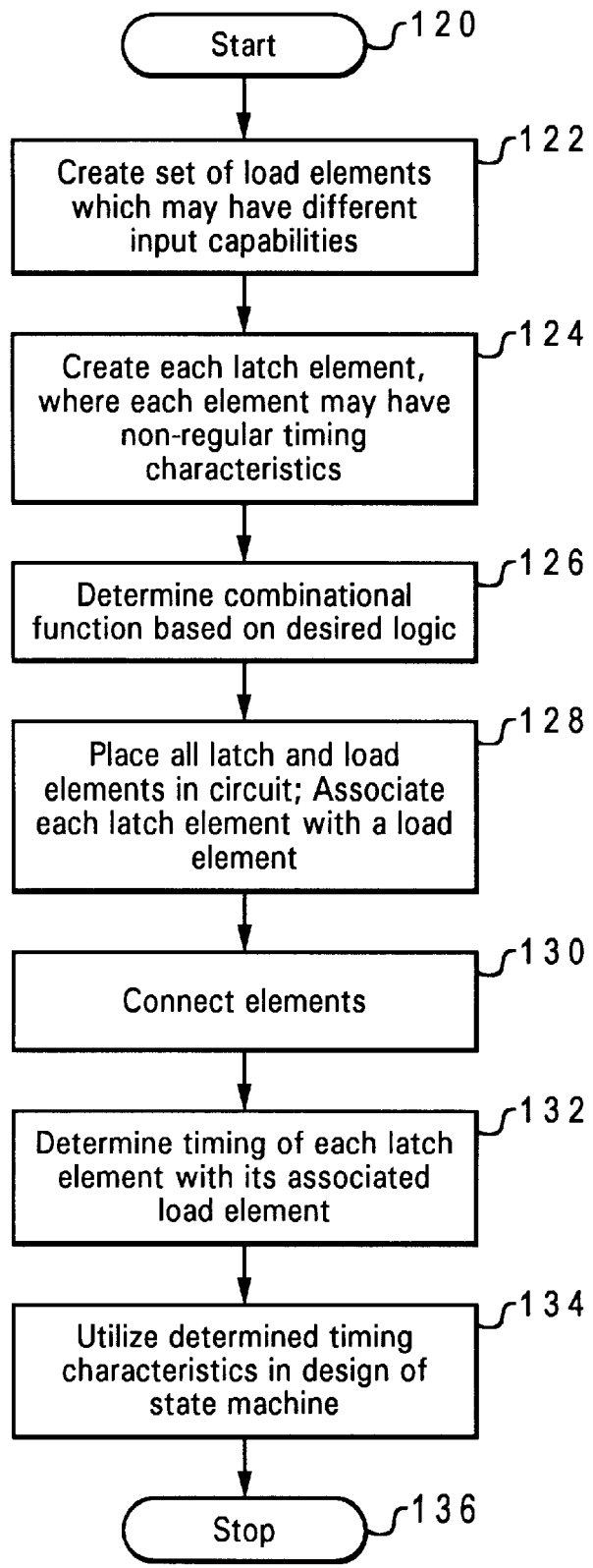
FIG. 4 is a high-level flow chart depicting the creation and placement of latch and load elements in a circuit and the determination of timing parameters of the circuit of FIG. 2 in accordance with a second embodiment of the method and system of the present invention.

FIG. 4 is a high-level flow chart depicting the determination of timing parameters of the circuit of FIG. 2 in accordance with the method and system of the present invention. The process begins as depicted at block 120 and thereafter passes to block 122 which illustrates the creation of a set of load elements which may, and most likely do, have different input capacitances. Thereafter, the process passes to block 124 which depicts the creation of a latch element, as depicted in FIG. 2, where each latch element may have irregular timing characteristics. Next, block 126 illustrates the determination of the combinational function of the overall circuit based on the desired logic for the circuit.

The process then passes to block 128 which depicts the placement of all latch and load elements in the overall circuit. The latch elements are placed in the circuit without consideration of the timing characteristics or input capacitance of any of the elements. Each latch element is associated with a load element. The load element may include one or more logic gates. Next, block 130 depicts the connection of all of the elements. Thereafter, block 132 illustrates the determination of the timing of each latch element with its associated load element connected to it. In this manner, the particular timing characteristics of each load element are determined with respect to its particular, associated load element. Thereafter, block 134 depicts the utilization of the timing characteristics of each latch element in designing the remaining elements of the state machine. The process then terminates as illustrated at block 136.

Figure 5:
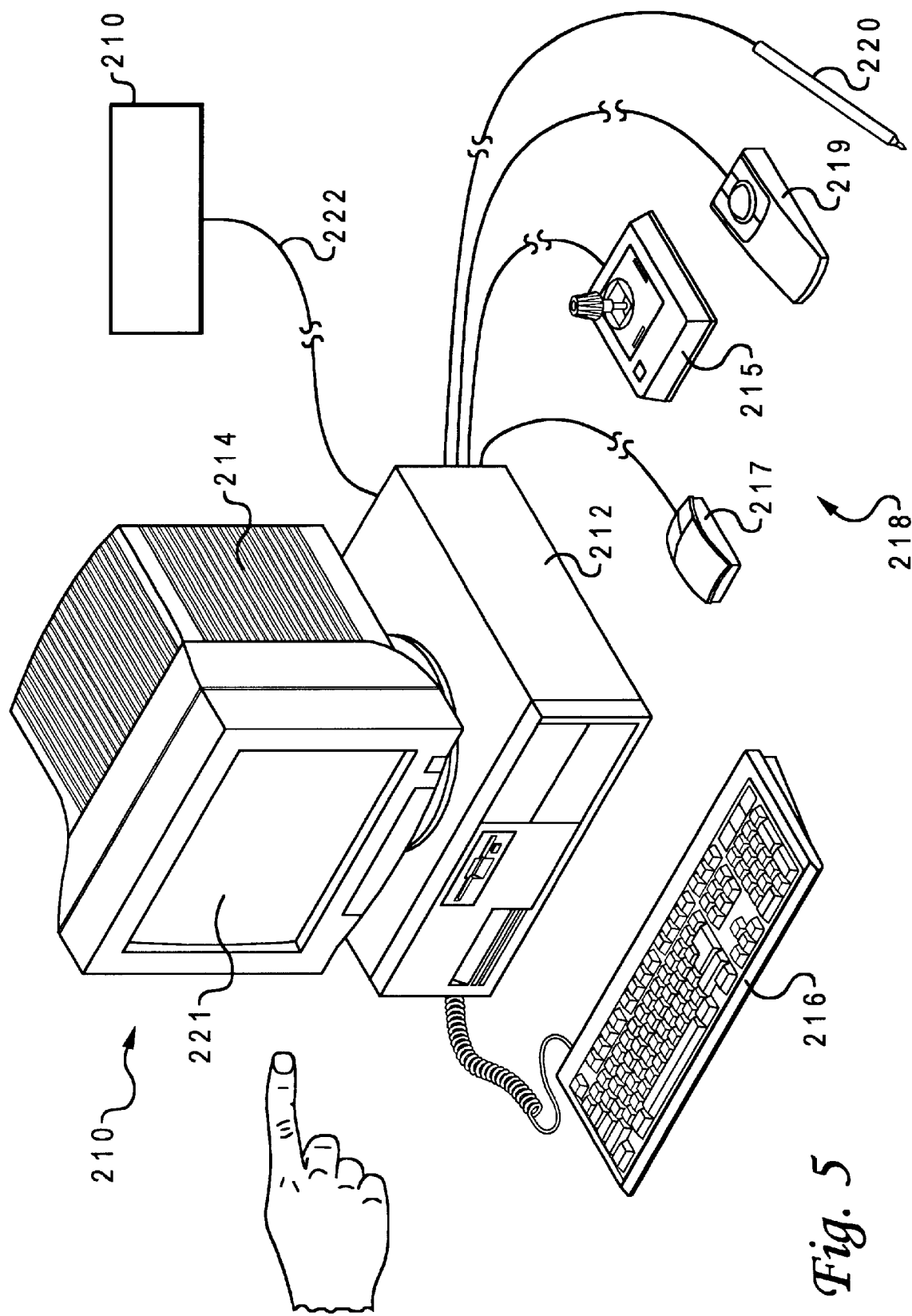
FIG. 5 illustrates a pictorial representation of a data-processing system which may be utilized to implement the method and system of the present invention.

FIG. 5 illustrates a pictorial representation of a data-processing system 210 which may be utilized to implement the method and system of the present invention. Data-processing system 210 includes a computer 212, computer display screen 214, a keyboard 216 and multiple input pointing devices 218. Those skilled in the art will recognize that input pointing devices 218 may be implemented utilizing a pointing stick 215, a mouse 217, a track ball 219, a pen 220 and/or other devices that permit a user to manipulate objects in a graphical manner on screen 214. Those skilled in the art will also recognize that any number of data-processing systems 210 may communicate with each other via a computer network 222.

Data-processing system 210 may be utilized to implement the method and system of the present invention. Typically, because of the complexity of today's VLSI circuits, the design of the VLSI circuit is accomplished utilizing a CAD (computer-aided design) software application. A CAD system will assist an engineer in the design of the individual circuit elements which make up state machines which are then incorporated into the design of the VLSI circuit.

Those skilled in the art will understand that many CAD software systems are commercially available which may be utilized to implement the method and system of the present invention. However, preferably, Composer IC Design Environment, manufactured by Cadence Design Inc. of San Jose, Calif., is utilized which includes a transistor-level timer.

The transistor-level timer, which is included in the CAD software, may be utilized to determine the timing characteristics of each latch element 10 and to design the remaining components of the state machine in which latch elements 10, 12 are to be utilized.

While a preferred embodiment has been particularly shown and described, it will be understood by those skilled in the art that various changes in form and detail may be made therein without departing from the spirit and scope of the present invention.

What is claimed is:

1. A semiconductor latch device, comprising:
   a main latch circuit including a transmission gate for receiving an input data signal and an input clock signal, said main latch circuit generating a latch output signal in response to a receipt of said input data and input clock signals;
   a feedback latch circuit receiving said latch output signal, storing said latch output signal and generating a feedback latch circuit output signal in response to a receipt of said latch output signal;
   said main latch circuit receiving said feedback latch circuit output signal, wherein said feedback latch circuit output signal is utilized to maintain said latch output signal; and
   an output signal line providing an output of said semiconductor latch device, said output signal line being directly connected to both said feedback latch circuit output signal and said transmission gate.

2. The device according to claim 1, wherein said main latch circuit comprises:
   an inverter for inverting said input clock signal and generating a complement clock signal;
   said transmission gate receiving as its inputs said input data signal and said complement clock signal, and generating a gate output; and
   an inverter for inverting said gate output and outputting an inverted gate output as said latch output signal.

3. The device according to claim 2, wherein said feedback latch circuit comprises:
   an inversion circuit receiving as its input said latch output signal and generating as an output an intermediate signal; and
   a switch circuit receiving as its input said intermediate signal and generating as its output said feedback latch circuit output signal, said switch capable of being controlled by said clock input signal and said clock complement signal.

4. A method in a data-processing system for reducing a delay associated with an insertion of a latch element into an integrated circuit, said method comprising the steps of:
   providing a latch element circuit to be included in an integrated circuit, said latch element circuit further including the steps of:
      providing a main latch circuit including a transmission gate for receiving an input data signal and an input clock signal, said main latch circuit generating a latch output signal in response to a receipt of said input data and input clock signals;
      providing a feedback latch circuit receiving said latch output signal, storing said latch output signal, and generating a feedback latch circuit output signal in response to a receipt of said latch output signal;
      said main latch circuit receiving said feedback latch circuit output signal, wherein said feedback latch circuit output signal is utilized to maintain said latch output signal; and
      providing an output signal line providing an output of said latch element circuit, said output signal line being directly connected to both said feedback latch circuit output signal and said transmission gate;
   determining timing characteristics of said latch element; and
   providing external circuitry necessary to complete said integrated circuit, said external circuitry having timing characteristics approximately equivalent to said timing characteristics of said latch element.

5. The method according to claim 4 wherein said step of providing a main latch circuit further comprises the steps of:
   providing an inverter for inverting said input clock signal and generating a complement clock signal;
   providing said transmission gate receiving as its inputs said input data signal and said complement clock signal and generating a gate output; and
   providing an inverter for inverting said gate output and outputting an inverted gate output as said latch output signal.

6. The device according to claim 5, wherein said step of providing a feedback latch circuit further comprises the steps of:
   providing an inversion circuit receiving as its input said [gate] latch output signal and generating as an output an intermediate signal; and providing a switch circuit receiving as its input said intermediate signal and generating as its output said feedback latch circuit output signal, said switch capable of being controlled by said clock input signal and said clock complement signal.

7. The method according to claim 6 wherein said step of determining timing characteristics of said latch element further includes the step of utilizing a transistor-level timer to determine said timing characteristics.

8. A method in a data-processing system for reducing a delay associated with an insertion of a latch element into an integrated circuit, said method comprising the steps of:

providing a latch element circuit to be included in an integrated circuit, said latch element circuit further including the steps of:

providing a main latch circuit including a transmission gate for receiving an input data signal and an input clock signal, said main latch circuit generating a latch output signal in response to a receipt of said input data and input clock signals;

providing a feedback latch circuit receiving said latch output signal, storing said latch output signal, and generating a feedback latch circuit output signal in response to a receipt of said latch output signal;

said main latch circuit receiving said feedback latch circuit output signal, wherein said feedback latch circuit output signal is utilized to maintain said latch output signal; and providing an output signal line providing an output of said latch element circuit, said output signal line being directly connected to both said feedback latch circuit output signal and said transmission gate;

associating a load element with said latch element;

determining timing characteristics of said latch element with said load element coupled to said latch element; and providing external circuitry necessary to complete said integrated circuit, said external circuitry having timing characteristics different from said timing characteristics of said latch element coupled to said load element.

9. The method according to claim 8 wherein said step of providing a main latch circuit further comprises the steps of:

providing an inverter for inverting said input clock signal and generating a complement clock signal;

providing said transmission gate receiving as its inputs said input data signal and said complement clock signal and generating a gate output; and providing an inverter for inverting said gate output and outputting an inverted gate output as said latch output signal.

10. The device according to claim 9, wherein said step of providing a feedback latch circuit further comprises the steps of:

providing an inversion circuit receiving as its input said latch output signal and generating as an output an intermediate signal; and providing a switch circuit receiving as its input said intermediate signal and generating as its output said feedback latch circuit output signal, said switch capable of being controlled by said clock input signal and said clock complement signal.

11. The method according to claim 10 wherein said step of determining timing characteristics of said latch element further includes the step of utilizing a transistor-level timer to determine said timing characteristics.

* * * * *